United States Patent
Bohr

(10) Patent No.: US 9,337,336 B2
(45) Date of Patent: May 10, 2016

(54) REPLACEMENT METAL GATES TO ENHANCE TRANISTOR STRAIN

(71) Applicant: Intel Corporation, Santa Clara, CA (US)

(72) Inventor: Mark T. Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/882,434

(22) Filed: Oct. 13, 2015

(65) Prior Publication Data

US 2016/0049510 A1 Feb. 18, 2016

Related U.S. Application Data

(60) Continuation of application No. 14/573,242, filed on Dec. 17, 2014, now Pat. No. 9,159,566, which is a continuation of application No. 13/909,792, filed on Jun. 4, 2013, now Pat. No. 8,946,016, which is a continuation of application No. 13/233,297, filed on Sep. 15, 2011, now abandoned, which is a division of application No. 11/305,465, filed on Dec. 16, 2005, now Pat. No. 8,101,485.

(51) Int. Cl.
| | |
|---|---|
| *H01L 29/78* | (2006.01) |
| *H01L 29/66* | (2006.01) |
| *H01L 29/49* | (2006.01) |
| *H01L 21/82* | (2006.01) |
| *H01L 21/8238* | (2006.01) |

(52) U.S. Cl.
CPC .... *H01L 29/7843* (2013.01); *H01L 21/823828* (2013.01); *H01L 21/823864* (2013.01); *H01L 29/4958* (2013.01); *H01L 29/66545* (2013.01)

(58) Field of Classification Search
CPC ............... H01L 21/282828; H01L 21/823864; H01L 29/4958; H01L 29/66545; H01L 29/7843; H01L 27/0922
See application file for complete search history.

(56) References Cited

U.S. PATENT DOCUMENTS

| | | | |
|---|---|---|---|
| 8,946,016 | B2 | 2/2015 | Bohr |
| 2003/0098491 | A1 | 5/2003 | Tsutsumi |
| 2004/0137685 | A1 | 7/2004 | Lochtefeld et al. |
| 2004/0137703 | A1 | 7/2004 | Gao et al. |
| 2004/0262683 | A1 | 12/2004 | Bohr et al. |
| 2005/0095852 | A1 | 5/2005 | Saenger et al. |
| 2005/0245036 | A1 | 11/2005 | Datta et al. |
| 2006/0068590 | A1 | 3/2006 | Lindert et al. |
| 2006/0071285 | A1 | 4/2006 | Datta et al. |
| 2006/0081942 | A1 | 4/2006 | Saito |
| 2006/0160317 | A1 | 7/2006 | Zhu et al. |
| 2006/0228848 | A1* | 10/2006 | Chan ................. H01L 21/76828 438/199 |
| 2006/0286729 | A1 | 12/2006 | Kavalieros et al. |
| 2006/0286758 | A1 | 12/2006 | Liang et al. |

* cited by examiner

*Primary Examiner* — Thanhha Pham
(74) *Attorney, Agent, or Firm* — Blakely, Sokoloff, Taylor & Zafman LLP

(57) ABSTRACT

Some embodiments of the present invention include apparatuses and methods relating to NMOS and PMOS transistor strain.

8 Claims, 4 Drawing Sheets

REPLACEMENT METAL GATES TO ENHANCE TRANISTOR STRAIN

This is a continuation of application Ser. No. 14/573,242 filed Dec. 17, 2014, now U.S. Pat. No. 9,159,566, which is a continuation of application Ser. No. 13/909,792 filed Jun. 4, 2013, now U.S. Pat. No. 8,946,016, which is a continuation of application Ser. No. 13/233,297 filed Sep. 15, 2011, which is a division of application Ser. No. 11/305,465 filed Dec. 16, 2005, now U.S. Pat. No. 8,101,485.

BACKGROUND

In semiconductor processing, transistors may be formed on semiconductor wafers. The transistors may include a gate structure having a gate dielectric and a gate electrode, a source, a drain, and a channel region between the source and the drain. In CMOS (complimentary metal oxide semiconductor) technology, transistors may typically be of two types: NMOS (negative channel metal oxide semiconductor) or PMOS (positive channel metal oxide semiconductor) transistors. The transistors and other devices may be interconnected to form integrated circuits (ICs) which perform numerous useful functions.

The performance of the ICs may directly depend on the performance of the transistors. Transistor performance may be improved by providing a strain in the channel region. Specifically, NMOS transistor performance may be improved by providing a tensile strain in the channel region and PMOS transistor performance may be improved by providing a compressive strain in the channel region.

BRIEF DESCRIPTION OF THE DRAWINGS

The invention is illustrated by way of example and not by way of limitation in the figures of the accompanying drawings, in which the like references indicate similar elements and in which.

The following Detailed Description is provided with reference to the accompanying figures. In the figures, the leftmost digit(s) of a reference number usually identifies the figure in which the reference number first appears. The use of the same reference numbers in different figures indicates similar or identical items.

DETAILED DESCRIPTION

In various embodiments, apparatuses and methods relating to strained transistors are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Transistor performance characteristics, such as transistor drive current, may be enhanced by providing strain to the transistor channels. For example, NMOS transistor performance may improve when the NMOS transistor channel is under lateral tensile stress. Also, PMOS transistor performance may improve when the PMOS transistor channel is under lateral compressive stress. Briefly, the present invention may provide for increased channel strain to enhance the performance of NMOS and PMOS transistors.

Figure 1:
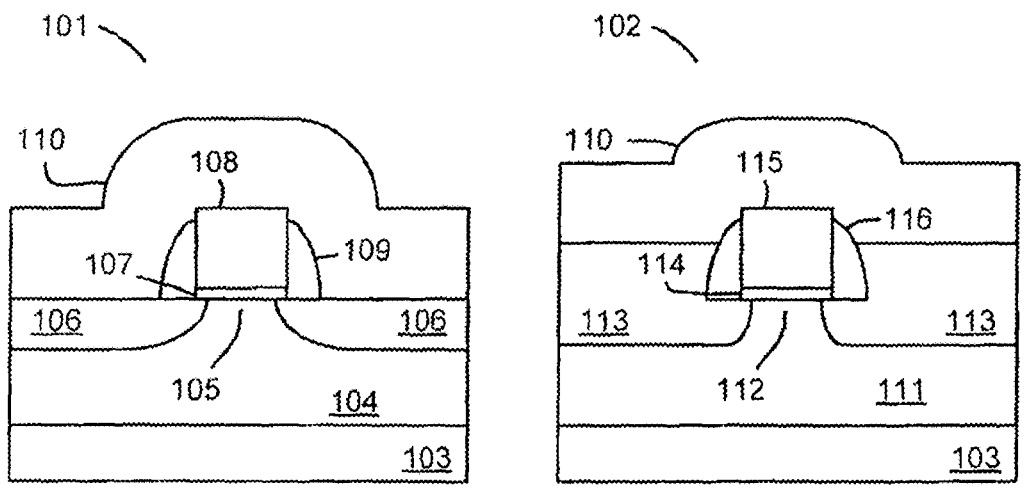
FIG. 1 is a cross-sectional view of a partially formed NMOS transistor and a partially formed PMOS transistor, and a layer over the transistor gate structures.

FIG. 1 illustrates an NMOS transistor 101 and a PMOS transistor 102 on a substrate 103. NMOS transistor 101 and PMOS transistor 102 may be on a continuous substrate 103. However, they are illustrated separately in FIGS. 1-10 for the sake of clarity. Substrate 103 may include any suitable semiconductor material. In an embodiment, substrate 103 may include monocrystalline silicon. Substrate 103 may also include isolation structures (not shown) to isolate the NMOS and PMOS transistors.

As shown, PMOS transistor 102 includes an n-well 111, a channel 112, source and drain films 113, a gate dielectric 114, a gate electrode 115 and spacers 116. PMOS transistor 102 may be formed by any suitable processing techniques.

N-well 111 may include any suitable n-type dopants, such as phosphorus and arsenic, and may be formed by any suitable technique. In an embodiment, n-well 111 may be formed by doping substrate 103 by ion implantation.

Channel 112 may be under a compressive strain from any stressor source or material. As discussed, a compressive strain may increase the performance of PMOS transistor 102. In an embodiment, source and drain films 113 may provide a compressive strain on channel 112. In such embodiments, source and drain films 113 may therefore be considered stressors. In an embodiment, source and drain films 113 may be epitaxial and may have a greater lattice spacing constant than n-well 111 and channel 112. Source and drain films 113 may transfer a compressive strain on channel 112 as they tend to, but are constrained from, expanding to their natural lattice spacing. In an embodiment, source and drain films 113 may include an alloy of materials. In an embodiment, source and drain films 113 may include an alloy of silicon and germanium. In an embodiment, source and drain films 113 may include a p-type dopant, such as boron. In an embodiment, source and drain films 113 may be formed in recesses of n-well 111.

As illustrated, channel 112 may be under a compressive strain from source and drain films 113. However, channel 112 may be under a compressive strain from any suitable stressor source or material. In an embodiment, a material may be formed over gate electrode 115 and spacers 116 to provide a compressive strain on channel 112.

Gate dielectric 114 may be any suitable material. In an embodiment, gate dielectric 114 may include silicon dioxide.

In other embodiments, gate dielectric 114 may include a high-k gate dielectric. In general, a high-k gate dielectric may include any material having a dielectric constant, k, that is greater than about 3.9 (the dielectric constant of silicon dioxide). In an embodiment, gate dielectric 114 may include hafnium oxide. In other embodiments, gate dielectric 114 may include hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobate.

Gate electrode 115 may include any suitable material. In an embodiment, gate electrode 115 may include polysilicon. In another embodiment, gate electrode 115 may include polysilicon doped with a p-type dopant, such as boron.

Gate dielectric 114 and gate electrode 115 together may be considered a gate stack or a gate structure. In an embodiment, both gate dielectric 114 and gate electrode 115 may be a part of the gate structure. In other embodiments, the gate structure may be a single material. In other embodiments, the gate structure may include a hard mask or any number of additional materials. As is described further below, a portion or an entirety of the gate structure may be removed to enhance the strain in channel 112. Therefore, a portion or an entirety of the gate structure may be considered sacrificial.

Spacers 116 may include any suitable dielectric materials, such as a nitride or an oxide. Spacers 116 may be along the sidewalls of gate electrode 108 and may therefore be considered sidewall spacers.

As shown, NMOS transistor 101 includes a p-well 104, a channel 105, source and drain regions 106, a gate dielectric 107, a gate electrode 108, and spacers 109. NMOS transistor 101 may be formed by any suitable processing techniques. P-well 104 may include any suitable p-type dopants, such as boron and indium, and may be formed by any suitable technique. Source and drain regions 106 may include any suitable n-type dopants, such as phosphorus and arsenic, and may be formed by any suitable technique, such as ion implantation or epitaxial deposition. Channel 105 may be between source and drain regions 106.

Gate dielectric 107 may be any suitable material. In an embodiment, gate dielectric 107 may include silicon dioxide. In other embodiments, gate dielectric 107 may include a high-k gate dielectric. In an embodiment, gate dielectric 107 may include hafnium oxide. In other embodiments, gate dielectric 107 may include hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobate. In an embodiment, gate dielectric 107 and gate dielectric 114 may include the same material.

Gate electrode 108 may include any suitable material. In an embodiment, gate electrode 108 may include polysilicon. In another embodiment, gate electrode 108 may include polysilicon doped with an n-type dopant, such as phosphorus and arsenic.

Gate dielectric 107 and gate electrode 108 together may be considered a gate stack or a gate structure. In an embodiment, both gate dielectric 107 and gate electrode 108 may be a part of the gate structure. In other embodiments, the gate structure may be a single material. In other embodiments, the gate structure may include a hard mask or any number of additional materials. As is described further below, a portion or an entirety of the gate structure may be removed to enhance the strain in channel 105. Therefore, a portion or an entirety of the gate structure may be considered sacrificial.

Spacers 109 may include any suitable dielectric materials, such as a nitride or an oxide. Spacers 109 may be along the sidewalls of gate electrode 108 and may therefore be considered sidewall spacers.

Channel 105 may be under a tensile strain from any stressor source. As discussed, a tensile strain in channel 105 may improve the performance of NMOS transistor 101. In an embodiment, a layer 110 may cover NMOS transistor 101 and PMOS transistor 102 and layer 110 may provide a tensile stress on channel 105 and channel 112 and may therefore be considered a tensile layer or a stressor. In an embodiment, layer 110 may include a silicon nitride, such as Si3N4. Layer 110 may be formed by any suitable technique. In an embodiment, a tensile strain in channel 112 may diminish the performance of PMOS transistor 102; however, due to source and drain films 113, channel 112 may be under a net compressive strain.

As discussed, channel 105 may be under a tensile strain due to layer 110. However, channel 105 may be under a tensile strain from any suitable stressor material or source. In an embodiment, source and drain regions 106 may provide a tensile strain on channel 105. In an embodiment, source and drain regions 106 may be epitaxial and may have a smaller lattice spacing constant than p-well 104 and channel 105. Source and drain regions 106 may then be constrained from achieving their natural lattice spacing and may transfer a tensile strain on channel 105 as they tend to, but are constrained from, contracting to their natural lattice spacing. In an embodiment, source and drain regions 106 films may include carbon.

NMOS transistor 101 and PMOS transistor 102 may also include other features that are not shown for the sake of clarity, such as halo implants, tip implants, silicide regions, and the like.

Figure 2:
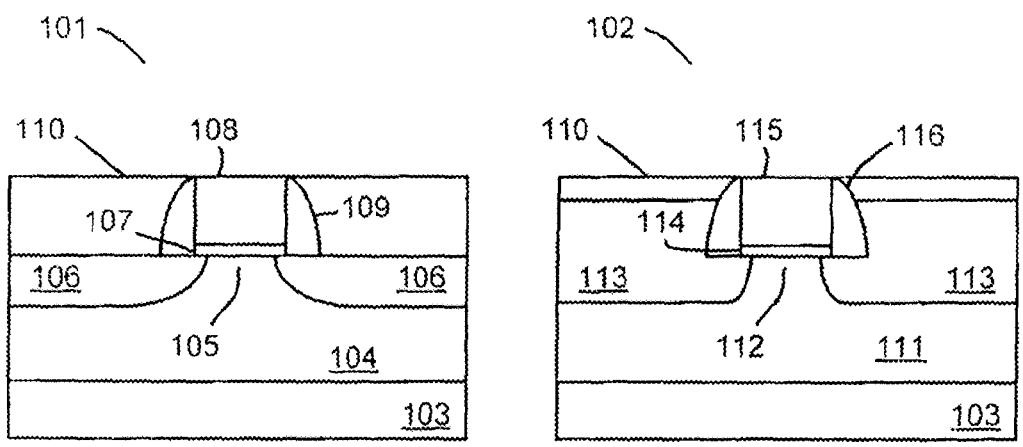
FIG. 2 is a view similar to FIG. 1 with a portion of the layer removed to expose the gate structures.

As illustrated in FIG. 2, a portion of layer 110 may be removed to expose gate electrode 108 and gate electrode 115. In an embodiment, a portion of layer 110 may be removed by a planarization or chemical mechanical polishing (CMP) process. In an embodiment, a portion of gate electrodes 108, 115 may also be removed.

Figure 3:
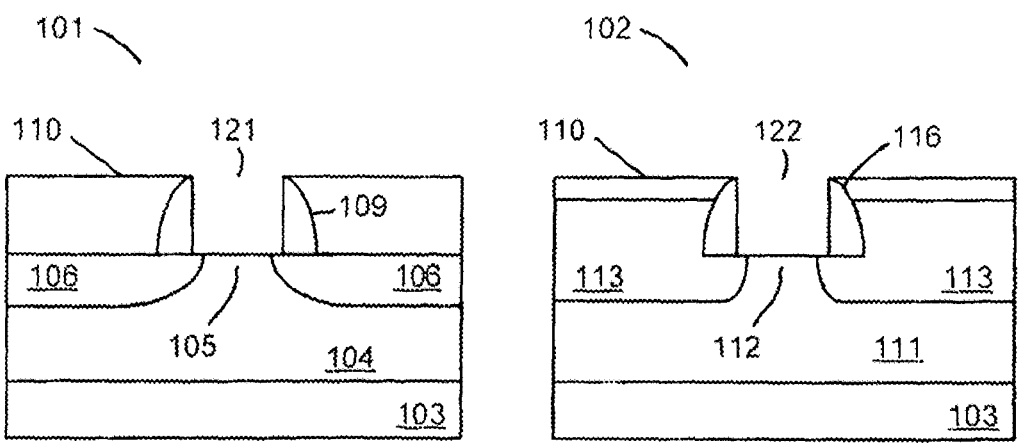
FIG. 3 is a view similar to FIG. 2 with the transistor gate structures removed to form trenches.

As illustrated in FIG. 3, gate electrodes 108, 115 and gate dielectrics 107, 114 may be removed to form trenches 121, 122. Gate electrodes 108, 115 and gate dielectrics 107, 114 may be removed by any suitable technique, such as a selective etch technique.

As discussed, channel 105 may be under a tensile strain and channel 112 may be under a compressive strain. Due to the removal of gate electrodes 108, 115 and gate dielectrics 107, 114, the strain on channels 105, 112 may be increased or enhanced. The increased strain may be due to the removal of material from trenches 121, 122, which may have been offsetting the desired stresses. In general, removing a portion or the entirety of a gate structure may remove an offsetting stress and allow the stressor to relax, which may increase the strain on the transistor channel. In other words, removing the gate structure may allow the stressor to enhance the desired strain on the channel.

In an embodiment, NMOS transistor 101 may include a stressor that is relaxed to increase a tensile strain on channel 105. In an embodiment, the stressor may include layer 110. In another embodiment, the stressor may include source and drain regions 106. In an embodiment, PMOS transistor 102 may include a stressor that is allowed to increase a compressive strain on channel 112. In an embodiment, the stressor may include source and drain films 113.

Figure 4:
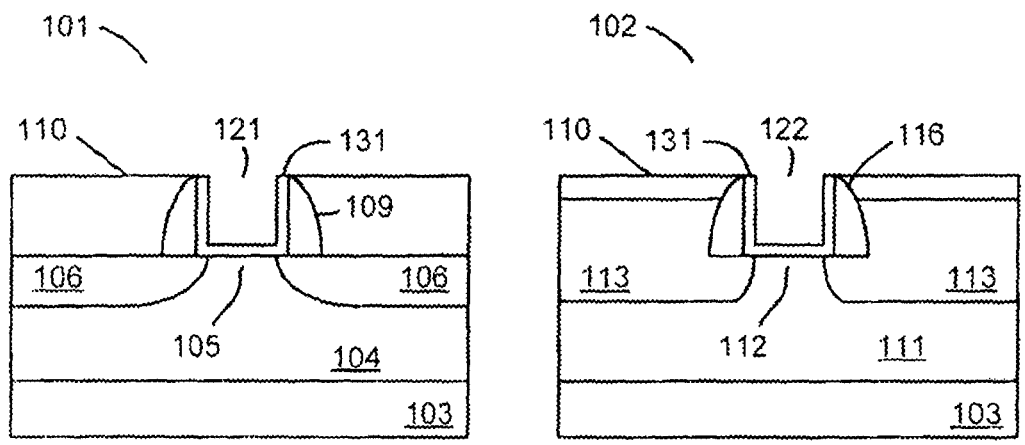
FIG. 4 is a view similar to FIG. 3 with a gate dielectric formed in the trenches.

As illustrated in FIG. 4, a gate dielectric 131 may be formed in trenches 121, 122. Gate dielectric 131 may be any suitable material and may be formed by any suitable technique. In an embodiment, gate dielectric 131 may include a high-k gate dielectric, such as hafnium oxide. In various other embodiments, gate dielectric 131 may include hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide aluminum oxide, lead scandium tantalum oxide, or lead zinc niobatc. In another embodiment, gate dielectric 131 may include silicon dioxide.

In an embodiment, gate dielectric 131 may be formed by a deposition process, such as chemical vapor deposition (CVD). As illustrated in FIG. 4, gate dielectric 131 may be formed along the bottom of trenches 121, 122 and along the sidewalls of trenches 121, 122. In an embodiment, gate dielectric 131 may also be formed over layer 110 (not shown). In such embodiments, gate dielectric 131 may be subsequently removed from layer 110 by a CMP process such that gate dielectric 131 only remains in trenches 121, 122.

Figure 5:
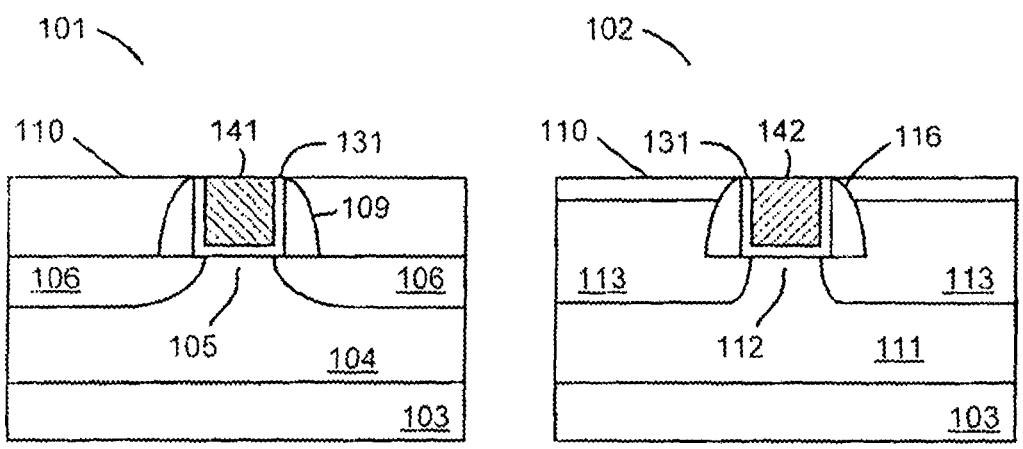
FIG. 5 is a view similar to FIG. 4 with gate electrodes formed in the trenches.

As illustrated in FIG. 5, a gate electrode 141 and a gate electrode 142 may be formed. Gate electrode 141 may include any suitable material or materials. In an embodiment, gate electrode 141 may include an n-doped polysilicon. In another embodiment, gate electrode 141 may include a metal with an n-type work function. In other embodiments, gate electrode 141 may include a stack or structure of materials with the material in contact with gate dielectric 131 including a material with an n-type work function. In various embodiments, the n-type work function material may include hafnium, zirconium, titanium, tantalum, aluminum, their alloys, or carbides of those metals.

In an embodiment, gate electrode 141 may include a material that provides an additional tensile strain on channel 105. Gate electrode 141 may provide an additional tensile strain on channel 105 by including a material with a coefficient of thermal expansion (CTE) less than the CTE of substrate 103 that is deposited at a temperature greater than room temperature and the operating temperature of NMOS transistor 101. Upon cooling, gate electrode 141 may contract more slowly than the surrounding materials and gate electrode 141 may then transfer a tensile strain to channel 105 via gate dielectric 131 or via spacers 109. In an embodiment, the material that provides the additional tensile strain may be the n-type work function metal, as listed above. In other embodiments, the material that provides the additional tensile strain may be another material in the gate structure. In an embodiment, the material that provides the additional tensile strain may include tungsten. In another embodiment, the material that provides the additional tensile strain may include titanium carbide.

Gate electrode 142 may include any suitable material or materials. In an embodiment, gate electrode 142 may include a p-doped polysilicon. In another embodiment, gate electrode 142 may include a metal with a p-type work function. In other embodiments, gate electrode 142 may include a stack or structure of various materials with the material in contact with gate dielectric 131 including a material with a p-type work function. In various embodiments, the p-type work function material may include ruthenium, palladium, platinum, cobalt, nickel, and their oxides.

In an embodiment, gate electrode 142 may include a metal that provides an additional compressive strain on channel 112. Gate electrode 142 may provide an additional compressive strain on channel 112 by including a material with a CTE greater than the CTE of substrate 103 that is deposited at a temperature greater than room temperature and the operating temperature of PMOS transistor 102. Upon cooling, gate electrode 142 may contract more quickly than the surrounding materials and gate electrode 142 may then transfer a compressive strain to channel 112 via gate dielectric 131 or via spacers 116. In an embodiment, the material that provides the additional compressive strain may be the p-type work function metal, as listed above. In other embodiments, the material that provides the additional compressive strain may be another material in the gate structure. In various embodiments, the material that provides the additional compressive strain may include boron carbide, tungsten, molybdenum, rhodium, vanadium, platinum, ruthenium, beryllium, palladium, cobalt, titanium, nickel, copper, tin, aluminum, lead, zinc, alloys of these metals, or their silicides.

Gate electrode 141 and gate electrode 142 may be formed by any suitable technique. In an embodiment, gate electrode 141 may be selectively formed and then gate electrode 142 may be selectively formed. In an embodiment, gate electrode 142 may be selectively formed and then gate electrode 141 may be selectively formed.

Figure 6:
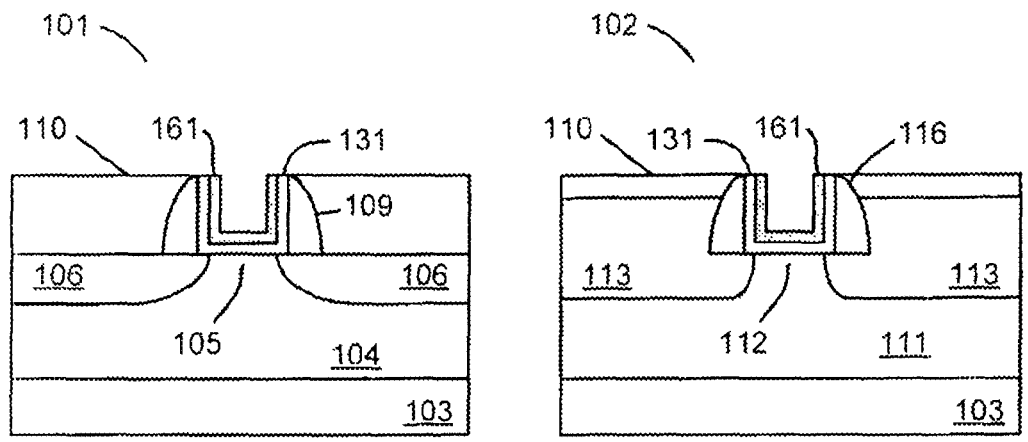
FIG. 6 is a view similar to FIG. 4 with an n-type material formed in the trenches.
Figure 7:
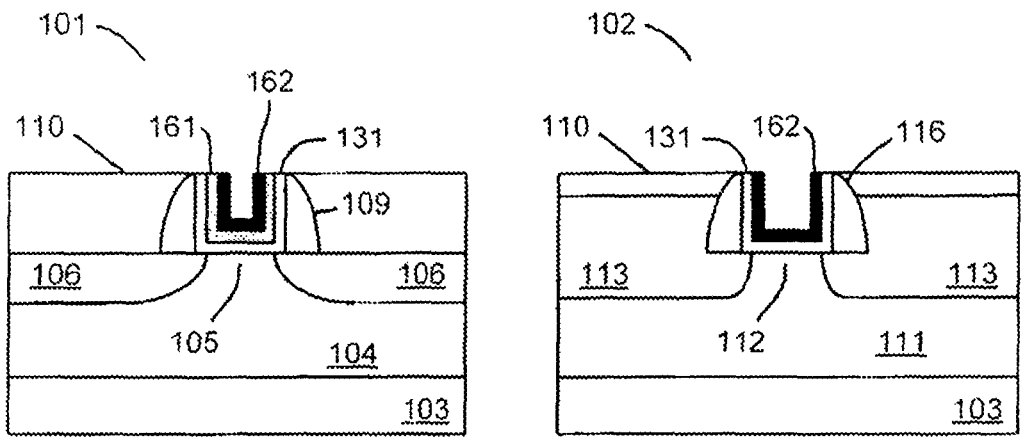
FIG. 7 is a view similar to FIG. 6 with a portion of the n-type material removed and a p-type material formed in the trenches.
Figure 8:
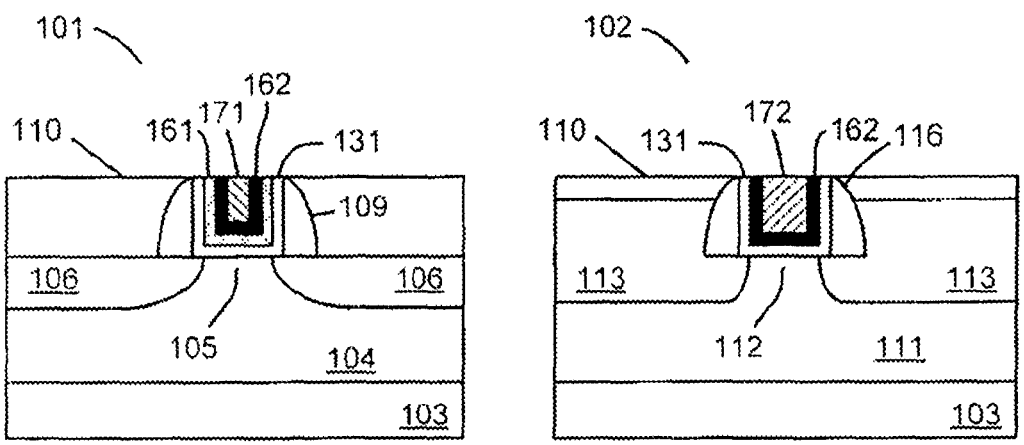
FIG. 8 is a view similar to FIG. 7 with fill materials formed in the trenches.

FIGS. 6-8 illustrate a method for forming gate electrodes with reference to the illustration of FIG. 4. As illustrated in FIG. 6, an n-type material 161 may be formed in trenches 121, 122. N-type material 161 may be any suitable n-type work function material as discussed above with reference to FIG. 5. In an embodiment, n-type material 161 may partially fill trenches 121, 122. In another embodiment, n-type material 161 may completely fill trenches 121, 122.

As illustrated in FIG. 7, n-type material 161 may be selectively removed from PMOS transistor 102 and a p-type material 162 may be formed. P-type material 162 may be any suitable p-type work function material as discussed above with reference to FIG. 5. In an embodiment, p-type material 162 may be formed such that an opening remains in either or both of the trenches. In another embodiment, p-type material 162 may complete the gate structure of PMOS transistor 102 or NMOS transistor 101.

As illustrated in FIG. 8, fill material 171 and fill material 172 may be selectively formed. Fill materials 171, 172 may be the same material or they may be different. In an embodiment, fill material 171 and fill material 172 may be chosen based on their conductive properties. In another embodiment, fill material 171 may be chosen to provide a tensile strain on NMOS transistor 101 as discussed with respect to FIG. 5. In various embodiments, fill material 171 may include tungsten or titanium carbide.

Fill material 172 may also include any suitable material. In an embodiment, fill material 172 may be chosen to provide a compressive strain on PMOS transistor 102 as discussed with respect to FIG. 5. In some embodiments, fill material 172 may include boron carbide, tungsten, molybdenum, rhodium, vanadium, platinum, ruthenium, beryllium, palladium, cobalt, titanium, nickel, copper, tin, aluminum, lead, zinc, alloys of these metals, or their silicides.

As illustrated in FIGS. 6-8, n-type material 161 may be formed and selectively removed, p-type material 162 may be formed, and optional fill materials may be formed. In another embodiment, the n-type and p-type materials may be formed in the opposite order. For example, the p-type material may be formed first. Then, the p-type material may be selectively removed from NMOS transistor 101 and a subsequent n-type material may then be formed. Lastly, optional fill materials may then be formed.

The illustrated methods of FIGS. 3-8 show trenches 121, 122 being formed and the stressors on channels 105, 112 being allowed to simultaneously increase the strain on channels 105, 112. However, in other embodiments, trenches 121, 122 may be formed and the strains increased independently. In an embodiment, trench 121 may be formed while gate dielectric 114 and gate electrode 115 remain. The strain on channel 105 of NMOS transistor 101 may then be independently increased. In another embodiment, trench 122 may be formed while gate dielectric 107 and gate electrode 108 remain. The strain on channel 112 of PMOS transistor 102 may then be independently increased.

Figure 9:
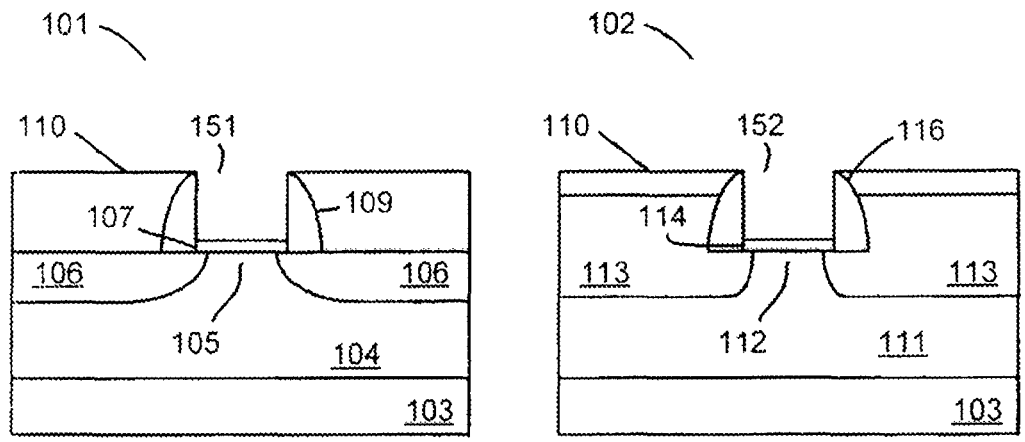
FIG. 9 is a view similar to FIG. 2 with a portion of the gate structures removed to form trenches.
Figure 10:
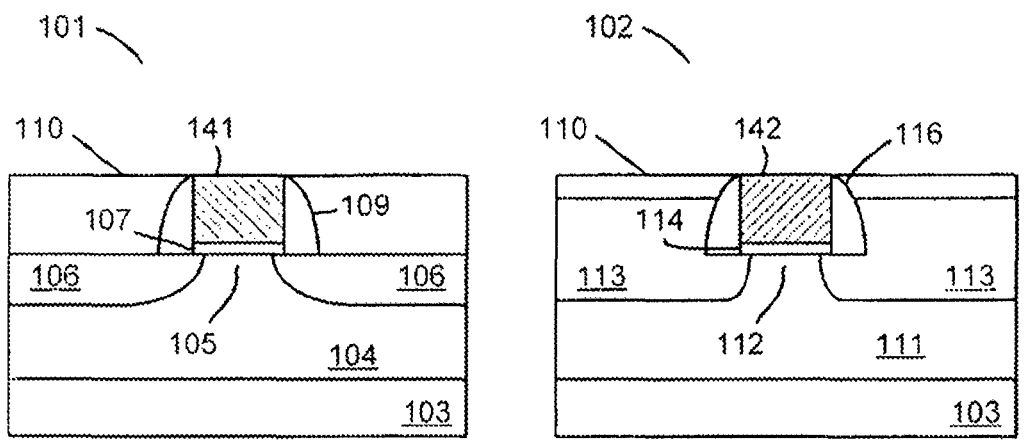
FIG. 10 is a view similar to FIG. 9 with gate electrodes formed in the trenches.

The methods illustrated in FIGS. 3-8 show the entire gate structure being sacrificial. As illustrated in FIGS. 9-10, only a portion of the gate structure may be sacrificial.

In FIG. 9, gate electrodes 108, 115 may be removed from the structure of FIG. 2 to form trenches 151, 152. Gate electrodes 108, 115 may be removed by any suitable technique such as a selective etch technique.

Due to the removal of gate electrodes 108, 115 the strain on channels 105, 112 may be increased. The increased strain may be due to the removal of material from trenches 151, 152, which may have been an offsetting stress to the desired stresses as discussed above.

As illustrated in FIG. 10, gate electrodes 141, 142 may be formed. Gate electrodes 141, 142 may include any of the materials or attributes and may be formed by any of the methods as discussed above with respect to FIGS. 5-8.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
    forming a PMOS transistor on a substrate, wherein the substrate further comprises an NMOS transistor disposed thereon, wherein the PMOS transistor comprises a first channel, a first gate structure disposed on the first channel, and first sidewall spacers adjacent the first gate structure;
    forming a compressive stressor adjacent to the first sidewall spacers;
    forming a tensile stressor over the compressive stressor, the first gate structure and the first sidewall spacers;
    removing a portion of the tensile stressor from over the first gate structure and leaving a portion of the tensile stressor on the first sidewall spacers and on the compressive stressor;
    forming a first trench in the first gate structure after removing the portion of the tensile stressor from the over the first gate structure;
    forming a first high-k gate dielectric in the first trench;
    forming a p-type work function material on the first high-k gate dielectric disposed in the first trench; and
    forming a first metal gate electrode over the p-type work function material.

2. The method of claim 1, wherein forming the first trench comprises removing a portion of the first gate structure by removing a first gate electrode and a first gate dielectric.

3. The method of claim 1, wherein the first metal gate electrode provides an additional compressive strain in the first channel.

4. The method of claim 3, wherein the first channel is further stressed via the first high-k gate dielectric.

5. The method of claim 3, wherein the first channel is further stressed via the first sidewall spacers.

6. The method of claim 3, wherein the first metal gate electrode includes a metal selected from the group consisting of ruthenium, palladium, platinum, cobalt and nickel.

7. The method of claim 3, wherein the NMOS transistor comprises a second gate structure disposed on a second channel and second sidewall spacers adjacent the second gate structure, the method further comprising:
    forming a second trench in the second gate structure;
    forming a second high-k gate dielectric in the second trench; and
    forming a second metal gate electrode over the second high-k gate dielectric.

8. The method of claim 7, wherein the second metal gate electrode provides a tensile strain in the second channel.

* * * * *